United States Patent
James et al.

(10) Patent No.: US 7,912,226 B1
(45) Date of Patent: Mar. 22, 2011

(54) AUTOMATIC MEASUREMENT OF AUDIO PRESENCE AND LEVEL BY DIRECT PROCESSING OF AN MPEG DATA STREAM

(75) Inventors: Thomas H. James, Pacific Palisades, CA (US); Jeffrey D. Carpenter, Pasadena, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 964 days.

(21) Appl. No.: 10/660,952

(22) Filed: Sep. 12, 2003

(51) Int. Cl.
*H04R 29/00* (2006.01)
*H03G 3/00* (2006.01)
*G10L 19/00* (2006.01)
*G10L 15/00* (2006.01)
*G08B 23/00* (2006.01)
*G08B 29/00* (2006.01)
*H04M 11/02* (2006.01)

(52) U.S. Cl. .......... 381/56; 381/104; 381/105; 381/106; 381/107; 381/58; 704/200.1; 704/500; 704/230; 704/235; 340/500; 340/506; 340/825.43

(58) Field of Classification Search .......... 381/102–109, 381/56–59, 1, 17–19; 704/200.1, 500, 230, 704/235
See application file for complete search history.

(56) References Cited

U.S. PATENT DOCUMENTS

| | | | |
|---|---|---|---|
| 3,627,914 A | 12/1971 | Davies | |
| 3,843,942 A * | 10/1974 | Pierret et al. | 333/18 |
| 4,934,483 A * | 6/1990 | Kallergis | 181/296 |
| 5,337,041 A * | 8/1994 | Friedman | 340/573.4 |
| 5,363,147 A | 11/1994 | Joseph et al. | |
| 5,404,315 A | 4/1995 | Nakano et al. | |
| 5,424,770 A | 6/1995 | Schmelzer et al. | |
| 5,448,568 A | 9/1995 | Delpuch et al. | |
| 5,461,619 A | 10/1995 | Citta et al. | |
| 5,463,620 A | 10/1995 | Sriram | |
| 5,506,844 A | 4/1996 | Rao | |
| 5,532,753 A | 7/1996 | Buchner et al. | |

(Continued)

FOREIGN PATENT DOCUMENTS

EP 1 150 446 A2 10/2001

(Continued)

OTHER PUBLICATIONS

Bhaskaran, V. Ed—Institute of Electrical and Electronics Engineers: "Mediaprocessing in the Compressed Domain" Digest of Papers of COMPCON (Computer Society Conference) 1996 Technologies for the Information Superhighway. Santa Clara, Feb. 25-28, 1996, Digest of Papers of the Computer Society Computer Conference COMPCON, Los Alamitos, IEEE Comp. Soc. Press, vol. Conf. 41, Feb. 25, 1996, pp. 204-209, XP010160896—ISBN: 0-8186-7414-8 *abstract*, *p. 208, right-hand column, paragraph 3—p. 209, left-hand column, paragraph 1*.

(Continued)

*Primary Examiner* — Devona E Faulk

(57) ABSTRACT

Automatic measurements are made of audio presence and level in an audio signal by direct processing of an MPEG data stream representing the audio signal, without reconstructing the audio signal. Sub-band data is extracted from the data stream, and the extracted sub-band data is dequantized and denormalized. An audio level for the dequantized and denormalized sub-band data is measured without reconstructing the audio signal. Channel characteristics are used in measuring the audio level of the sub-band data, wherein the channel characteristics are used to weight the measured levels. The measured levels are compared against at least one threshold to determine whether an alarm should be triggered.

16 Claims, 5 Drawing Sheets

U.S. PATENT DOCUMENTS

| | | | |
|---|---|---|---|
| 5,579,404 A | 11/1996 | Fielder et al. | |
| 5,625,743 A * | 4/1997 | Fiocca | 704/205 |
| 5,650,825 A | 7/1997 | Naimpally et al. | |
| 5,657,454 A | 8/1997 | Benbassat et al. | |
| 5,666,430 A | 9/1997 | Rzeszewski | |
| 5,729,556 A | 3/1998 | Benbassat et al. | |
| 5,751,723 A | 5/1998 | Vanden Heuvel et al. | |
| 5,778,077 A | 7/1998 | Davidson | |
| 5,802,068 A | 9/1998 | Kudo | |
| 5,822,018 A | 10/1998 | Farmer | |
| 5,831,681 A | 11/1998 | Takahashi et al. | |
| 5,854,658 A | 12/1998 | Uz et al. | |
| 5,864,557 A | 1/1999 | Lyons | |
| 5,877,821 A | 3/1999 | Newlin et al. | |
| 5,898,675 A | 4/1999 | Nahumi | |
| 5,912,890 A | 6/1999 | Park | |
| 5,966,120 A | 10/1999 | Arazi et al. | |
| 5,987,031 A | 11/1999 | Miller et al. | |
| 5,991,812 A | 11/1999 | Srinivasan | |
| 6,026,232 A | 2/2000 | Yogeshwar et al. | |
| 6,047,178 A * | 4/2000 | Frlan | 455/423 |
| 6,064,676 A | 5/2000 | Slattery et al. | |
| 6,137,834 A | 10/2000 | Wine et al. | |
| 6,169,584 B1 | 1/2001 | Glaab et al. | |
| 6,169,807 B1 | 1/2001 | Sansur | |
| 6,169,973 B1 | 1/2001 | Tsutsui et al. | |
| 6,188,439 B1 | 2/2001 | Kim | |
| 6,195,438 B1 | 2/2001 | Yumoto et al. | |
| 6,208,666 B1 | 3/2001 | Lawrence et al. | |
| 6,219,043 B1 | 4/2001 | Yogeshwar et al. | |
| 6,252,848 B1 | 6/2001 | Skirmont | |
| 6,259,695 B1 | 7/2001 | Ofek | |
| 6,298,089 B1 | 10/2001 | Gazit | |
| 6,369,855 B1 | 4/2002 | Chauvel et al. | |
| 6,389,019 B1 | 5/2002 | Fan et al. | |
| 6,429,779 B1 * | 8/2002 | Petrillo et al. | 340/644 |
| 6,430,233 B1 | 8/2002 | Dillon et al. | |
| 6,687,247 B1 | 2/2004 | Wilford et al. | |
| 6,765,867 B2 | 7/2004 | Shanley et al. | |
| 6,801,886 B1 * | 10/2004 | Pai et al. | 704/200.1 |
| 6,931,370 B1 * | 8/2005 | McDowell | 704/200.1 |
| 7,035,278 B2 | 4/2006 | Bertram et al. | |
| 2001/0016048 A1 | 8/2001 | Rapeli | |
| 2001/0047256 A1 * | 11/2001 | Tsurushima et al. | 704/200 |
| 2001/0047267 A1 | 11/2001 | Abiko et al. | |
| 2002/0004718 A1 | 1/2002 | Hasegawa et al. | |
| 2002/0085584 A1 | 7/2002 | Itawaki et al. | |
| 2002/0146023 A1 | 10/2002 | Myers | |
| 2002/0150057 A1 | 10/2002 | McClary | |
| 2002/0169599 A1 | 11/2002 | Suzuki | |
| 2002/0173864 A1 * | 11/2002 | Smith | 700/94 |
| 2004/0199933 A1 * | 10/2004 | Ficco | 725/151 |

FOREIGN PATENT DOCUMENTS

| | | |
|---|---|---|
| GB | 2341745 | 3/2000 |
| JP | 10-284960 | 10/1998 |
| JP | 10 284960 | 10/1998 |
| JP | 2001-111969 | 4/2001 |
| JP | 2001 169248 | 6/2001 |
| JP | 2001-169248 | 6/2001 |
| WO | WO 99/53612 | 10/1999 |
| WO | 0130086 | 4/2001 |

OTHER PUBLICATIONS

Brandenburg, K. et al.: 'ISO-MPEG-1 Audio: A Generic Standard for Coding of High-Quality Digital Audio Journal of the Audio Engineering Society, Audio Engineering Society. New York, US, vol. 42, No. 10, Oct. 1994, pp. 780-792, XP000978167—ISSN: 0004-7554 *abstract*, *p. 785, left-hand column, paragraph 2—p. 786, left-hand column, paragraph 1; figures 2,3*.

Hans, M. et al.: "An MPEG Audio Layered Transcoder"—Preprints of Papers Presented at the AES Convention, XX, XX, Sep. 1998, pp. 1-18, XP001014304—*abstract*, *p. 11, paragraph 1*.

Govindan et al., *Scheduling And IPC Mechanisms For Continuous Media*, 13th ACM Symposium On Operating Systems Principles, 1991, 13 pages.

Smith, Nigel; "Satellite Data Broadcasting—An End to the World-Wide Wait!"; NDS Data Broadcasting Article; 1997 The Institute of Electrical Engineers; published by IEE, Savoy Place, London, U.K.; pp. 6/1-6/11; XP 6502899.

U.S. Appl. No. 10/038,174, filed Jan. 3, 2002, Leon J. Stanger, Notice of Allowance dated Jan. 11, 2008.

U.S. Appl. No. 10/426,664, filed Apr. 30, 2003, James A. Michener, Non-final Office Action dated Nov. 28, 2007.

Non-final Office Action dated Jun. 4, 2008 in U.S. Appl. No. 10/426,684, filed Apr. 30, 2003 by James A. Michener.

Japanese Official Letter of Inquiry dated Nov. 11, 2008 in Japanese Patent Application No. 2002-278471 filed Dec. 26, 2002 by Leon Stanger et al.

Final Rejection dated Jun. 10, 2009 in U.S. Appl. No. 10/426,664, filed Apr. 30, 2003 by James A. Michener.

Non-final Office Action dated Dec. 22, 2008 in U.S. Appl. No. 10/426,664, filed Apr. 30, 2003 by James Michener.

Notice of Allowance dated Aug. 24, 2009 in U.S. Appl. No. 10/426,664, filed Apr. 30, 2003 by James A. Michener.

Non-final Office action dated Mar. 15, 2010 in U.S. Appl. No. 12/106,477, filed Apr. 21, 2008 by Leon J. Stanger et al.

Notice of Allowance dated Jul. 30, 2010 in U.S. Appl. No. 12/106,477, filed Apr. 21, 2008 by Leon J. Stanger et al.

* cited by examiner

AUTOMATIC MEASUREMENT OF AUDIO PRESENCE AND LEVEL BY DIRECT PROCESSING OF AN MPEG DATA STREAM

CROSS-REFERENCE TO RELATED APPLICATIONS

The present application is related to the following applications:

U.S. patent application Ser. No. 10/426,664, filed Apr. 30, 2003;

U.S. patent application Ser. No. 10/192,960, filed Jul. 10, 2002, now U.S. Pat. No. 7,286,473, issued Oct. 23, 2007; and U.S. patent application Ser. No. 10/038,174, filed Jan. 3, 2002.

BACKGROUND OF THE INVENTION

1. Field of the Invention

The present invention relates to the automatic measurement of audio presence and level by direct processing of an MPEG data stream.

2. Description of the Related Art

Digital television, such as that provided by DIRECTV®, the assignee of the present invention, is typically transmitted as a digital data stream encoded using the MPEG (Motion Pictures Experts Group) standard promulgated by the ISO (International Standards Organization). MPEG provides an efficient way to represent video and audio in the form of a compressed bit stream. The MPEG-1 standard is described in a document entitled "Coding of Moving Pictures and Associated Audio for Digital Storage Media at up to about 1.5 MBit/s," ISO/IEC 11172 (1993), which is incorporated by reference herein.

DIRECTV® broadcasts hundreds of channels to its subscribers encoded into different MPEG data streams. However, problems can arise in using these different MPEG data streams, due to the fact that it is difficult to monitor the audio levels of all of the different channels. Thus, the different MPEG data streams may appear to be either too loud or too soft, as compared to other channels, or there may be a loss of audio that is not noticed for some time.

In the prior art, special purpose devices would be used to measure audio levels. However, these special purpose devices require a separate satellite receiver to tune and decode the audio. In addition, these devices generally are not easily integrated into a system architecture in order to control and report and alarm on the measurements.

Consequently, there is a need to monitor the audio levels of an MPEG data stream. Moreover, there is need for the ability to monitor audio levels of MPEG data streams without decompressing the audio data within the MPEG data streams.

SUMMARY OF THE INVENTION

The present invention discloses a method, apparatus and article of manufacture for automatic measurements of audio presence and level in an audio signal by direct processing of an MPEG data stream representing the audio signal, without reconstructing the audio signal. Sub-band data is extracted from the data stream, and the extracted sub-band data is dequantized and denormalized. An audio level for the dequantized and denormalized sub-band data is measured without reconstructing the audio signal. Channel characteristics are used in measuring the audio level of the sub-band data, wherein the channel characteristics are used to weight the measured levels. The measured levels are compared against at least one threshold to determine whether an alarm should be triggered.

DETAILED DESCRIPTION OF PREFERRED EMBODIMENTS

In the following description, reference is made to the accompanying drawings that form a part hereof, and which show, by way of illustration, several embodiments of the present invention. It is understood that other embodiments may be utilized and structural changes may be made without departing from the scope of the present invention.

Overview

The present invention provides automatic measurements of audio presence and level in an audio signal by direct processing of an MPEG data stream representing the audio signal, without reconstructing the audio signal. Consequently, if the audio level in an MPEG data stream is too high or too low, the audio level can be detected and adjusted as desired in order to maintain uniform listening levels.

A preferred embodiment of the present invention comprises an audio presence and level monitoring system that uses a satellite receiver card connected to a computer system. The satellite receiver card has the capability to receive and process a plurality of MPEG data streams concurrently and make them available to a software program executed by the computer system. The software program calculates the perceived loudness directly from the MPEG data streams without reconstruction of the audio signal.

The present invention can be employed to continuously monitor the audio presence and levels within the MPEG data streams for a video distribution system, such as a satellite broadcast system. Most video distribution systems include many active audio streams and it is important to subscribers that these audio streams are set to the proper level, so as not make channel change objectionable. The audio presence and level monitoring system accomplishes this task with a minimal amount of expense. Moreover, since the system comprises satellite receiver cards integrated into the host computer, the control of the system and the reporting of results are simple to implement.

The present invention improves the quality of services provided to the subscribers of the video distribution system, as well as lowering the cost of providing these services. In particular, the present invention permits audio problems to be recognized and handled more quickly. In the prior art, monitoring of audio presence and levels is a labor intensive activity, since a person assigned to perform this task manually can only listen to one audio stream at a time. For example, in a large multi-channel system, there have been instances where a secondary audio channel has been inoperative for more than a day.

Video Distribution System

Figure 1:
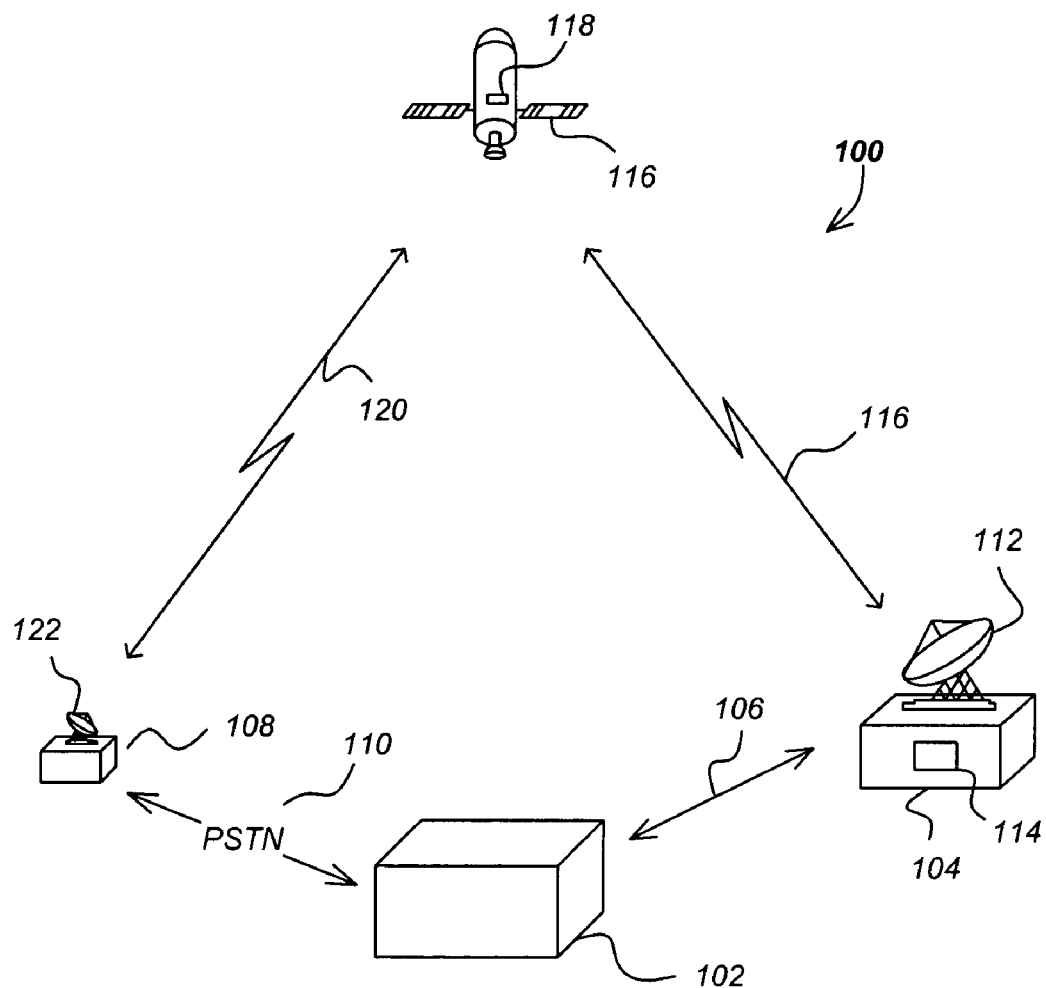
FIG. 1 is a diagram illustrating an overview of a video distribution system according to a preferred embodiment of the present invention.

FIG. 1 is a diagram illustrating an overview of a video distribution system 100 according to a preferred embodiment of the present invention. The video distribution system 100 comprises a control center 102 in communication with an uplink center 104 via a ground link 106 and with subscriber receiving stations 108 via a link 110. The control center 102 provides program material to the uplink center 104, coordinates with the subscriber receiving stations 108 to offer pay-per-view (PPV) program services, including billing and associated decryption of video programs.

The uplink center 104 receives the program material from the control center 102 and, using an uplink antenna 112 and transmitter 114, transmits the program material to one or more satellites 116, each of which may include one or more transponders 118. The satellites 116 receive and process this information, and transmit the program material to subscriber receiving stations 108 via downlink 120 using transmitter 118. Subscriber receiving stations 108 receive this information using via an antenna 122 of the subscriber receiving stations 108.

While the invention disclosed herein will be described with reference to a satellite based video distribution system 100, the present invention may also be practiced with terrestrial-based video distribution system, whether by antenna, cable, or other means. Further, the different functions collectively allocated among the control center 102 and the uplink center 104 as described above can be reallocated as desired without departing from the intended scope of the present invention.

Although the foregoing has been described with respect to an embodiment in which the program material delivered to the subscriber is video (and audio) program material such as a movie, the foregoing method can be used to deliver program material comprising purely audio program material as well. In both instances, the audio program material is encoded as an MPEG audio data stream.

MPEG Audio Data Stream

Figure 2:
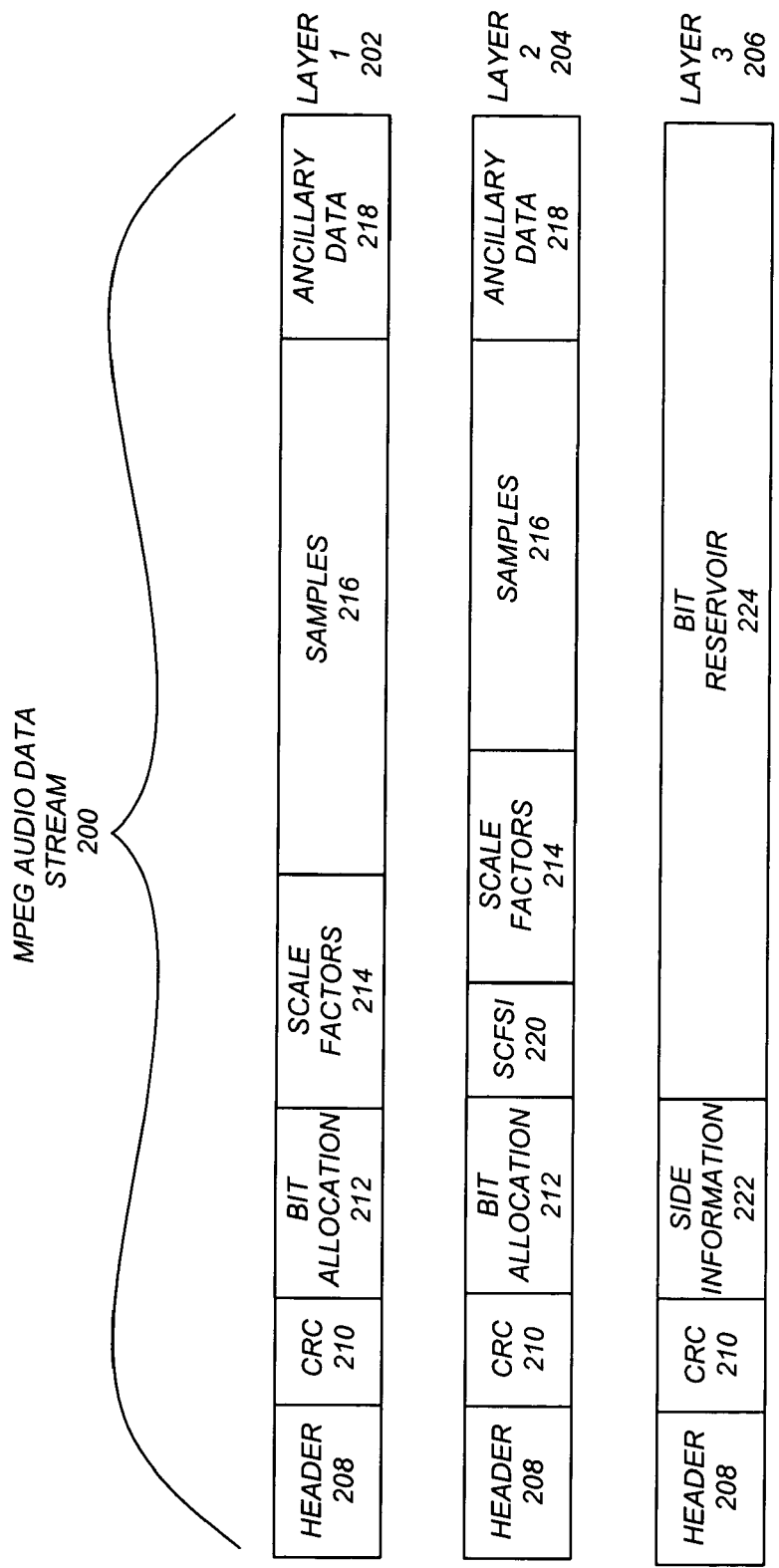
FIG. 2 is a block diagram that illustrates the structure of an MPEG audio data stream.

FIG. 2 is a block diagram that illustrates the structure of an MPEG audio data stream 200. Layers I, II and III within the MPEG audio data stream 200 are shown as separate frames 202, 204 and 206.

Each frame 202, 204 and 206 includes a Header 208, which is followed by an optional cyclic redundancy check (CRC) 210 that is 16 bits in length. The Header 208 is 32 bits and includes the following information:

Sync Word—12 bits (all 1 s)
System Word—20 bits
  Version id—1 bit
  Layer—2 bits
  Error Protection—1 bit
  Bit Rate Index—4 bits
  Sampling Frequency Rate Index—2 bits
  Padding—1 bit
  Private—1 bit
  Mode—2 bits
  Mode Extension—2 bits
  Copyright—1 bit
  Original or copy—1 bit
  Emphasis—2 bits The CRC 210, if present, is used for detecting errors.

In the frame 202 of Layer 1, the CRC 210 is followed by a Bit Allocation 212 (128-256 bits in length), Scale Factors 214 (0-384 bits in length), Samples 216 (384 bits in length), and Ancillary Data 218. In the frame 204 of Layer 2, the CRC 210 is followed by a Bit Allocation 212 (26-188 bits in length), Scale Factor Selection Information (SCFSI) 220 (0-60 bits in length), Scale Factors 214 (0-1080 bits in length), Samples 216 (1152 bits in length), and Ancillary Data 218. In the frame 206 of Layer 3, the CRC 210 is followed by Side Information 222 (136-256 bits in length) and a Bit Reservoir 224.

In both Layers I and II, the time-frequency mapping of the audio signal uses a polyphase filter bank with 32 sub-bands, wherein the sub-bands are equally spaced in frequency. The Layer 1 psychoacoustic model uses a 512-point Fast Fourier Transform (FFT) to obtain detailed spectral information about the audio signal, while the Layer 2 psychoacoustic model, which is similar to the Layer 1 psychoacoustic model, uses a 1024-point FFT for greater frequency resolution of the audio signal. Both the Layer 1 and II quantizers examine the data in each sub-band to determine the Bit Allocation 212 and Scale Factor 214 for each sub-band, and then linearly quantize the data in each sub-band according to the Bit Allocation 212 and Scale Factor 214 for that sub-band.

The Bit Allocation 212 determines the number of bits per sample for Layer 1, or the number of quantization levels for Layer 2. Specifically, the Bit Allocation 212 specifies the number of bits assigned for quantization of each sub-band. These assignments are made adaptively, according to the information content of the audio signal, so the Bit Allocation 212 varies in each frame 202, 204. The Samples 216 can be coded with zero bits (i.e., no data are present), or with two to fifteen bits per sample.

The Scale Factors 214 are coded to indicate sixty-three possible values that are coded as six-bit index patterns from "000000" (0), which designates the maximum scale factor, to "111110" (62), which designates the minimum scale factor. Each sub-band in the Samples 216 has an associated Scale Factor 214 that defines the level at which each sub-band is recombined during decoding.

The Samples 216 themselves comprise the linearly quantized data, e.g., samples, for each of thirty-two sub-bands. A Layer 1 frame 202 comprises twelve samples per sub-band. A Layer 2 frame 204 comprises thirty-six samples per sub-band.

In Layer 2 204, the Samples 216 in each frame are divided into three parts, wherein each part comprises twelve samples per sub-band. For each sub-band, the SCFSI 220 indicates whether the three parts have separate Scale Factors 214, or all three parts have the same Scale Factor 214, or two parts (the first two or the last two) have one Scale Factor 214 and the other part has another Scale Factor 214.

Monitoring System

Figure 3:
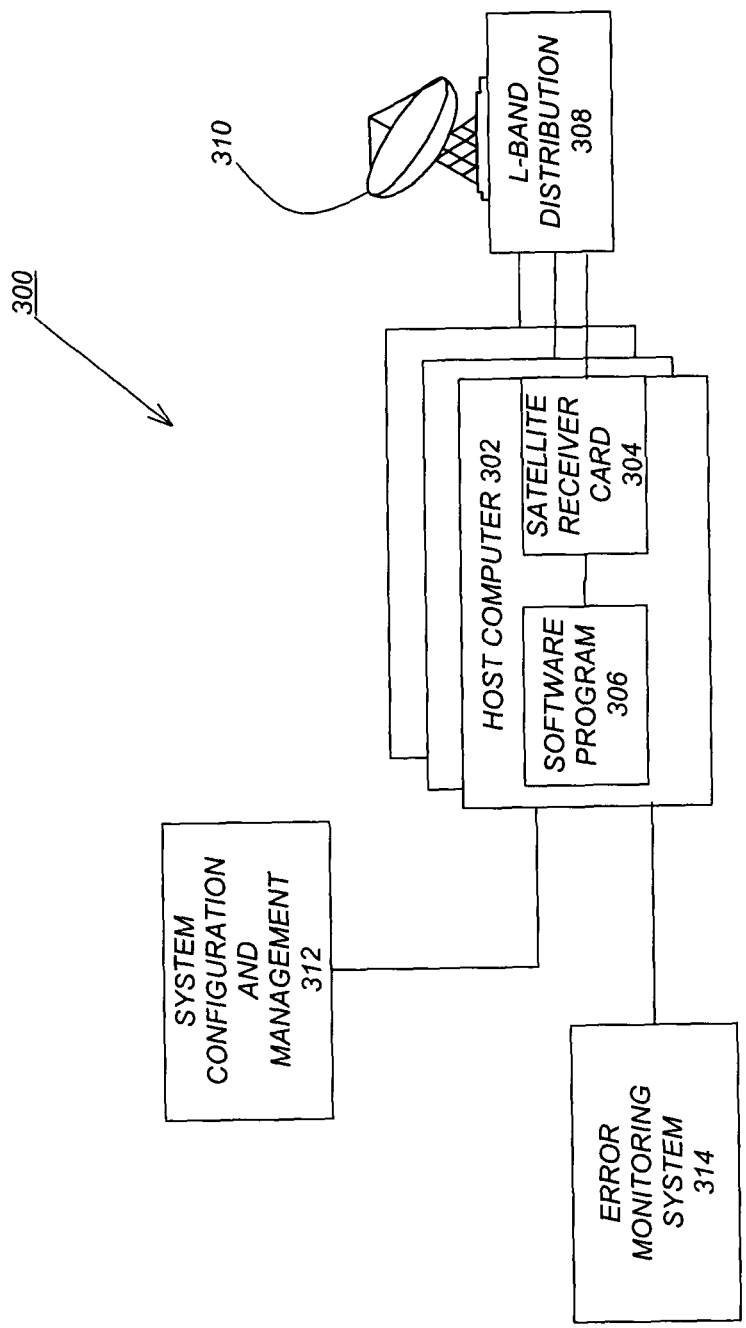
FIG. 3 is a diagram illustrating an audio presence and level monitoring system according the preferred embodiment of the present invention.

FIG. 3 is a diagram illustrating a audio presence and level monitoring system 300 according the preferred embodiment of the present invention. The audio presence and level monitoring system 300 may comprise one or more of the subscriber receiver stations 108 described in FIG. 1, although the audio presence and level monitoring system 300 may also comprise a component of the control center 102 or uplink center 104 described in FIG. 1. Indeed, the audio presence and level monitoring system 300 may be located wherever it is convenient for monitoring MPEG audio data streams.

The audio presence and level monitoring system 300 includes one or more host computers 302, each of which includes at least one satellite receiver card 304 and software program 306 executed by the host computer 300, or alternatively, by the satellite receiver card 304. The satellite receiver card 304 is coupled to an L-band distribution device 308, which includes a satellite dish 310, in order to receive one or more MPEG audio data streams. A system configuration and management system 312 is used to configure and manage the host computers 302 and satellite receiver cards 304, while an error monitoring system 314 is notified if any errors are detected in the MPEG audio data streams.

Preferably, the satellite receiver card 304 has the capability to tune a plurality of MPEG audio data streams at once. The MPEG audio data streams are then transferred directly to memory in the host computer 302.

The software program 306 comprises an MPEG audio parser that accesses the MPEG audio data stream from the memory and rebuilds the data therein into Layer 2 frames 204, in order to access a set of sub-bands in the Samples 216. However, instead of reconstructing the audio signal, which would complete the normal decoding process for the MPEG audio data stream 200, the sub-band data in the Samples 216 are processed in an audio presence and level function performed by the software program 306, since the sub-band data is already represented in a fashion that is easily scalable for the human ear sensitivity.

The audio presence and level function performed by the software program 306 typically involves measuring the power of the sub-band data in the Samples 216, wherein the power is measured as a square root of a sum of squares of the sub-band data. The software program 306 then averages and thresholds the measured power over time to calculate the level. However, the details of the calculation may vary by application.

For audio presence detection, the signal power will go to zero (or below a low threshold). The channel characteristics can be used to determine the length of time the signal power is at zero before considering the audio signal as being lost. Moreover, thresholds can be set to generate an alarm based on loss of the audio signal, or when the average level of the audio signal is too high or too low.

As most of the processing is in the software program 306, there is no need for specialized hardware and wiring for each channel. In one embodiment, the system 300 is capable of measuring all the MPEG audio data streams on a transponder with one satellite receiver card 304, which entails processing 20-30 channels in parallel per satellite receiver card 304.

In one embodiment, a single satellite receiver card 304 can be dedicated to each transponder for full time monitoring. On the other hand, if each of the MPEG audio data streams need only to be sampled occasionally, then in an alternative embodiment, a single satellite receiver card 304 can be re-tuned to different transponders, to sample different channels, and monitor an entire video broadcast system by cycling through a full set (e.g., 40-60) of transponders.

Audio Presence and Level Function

Figure 4:
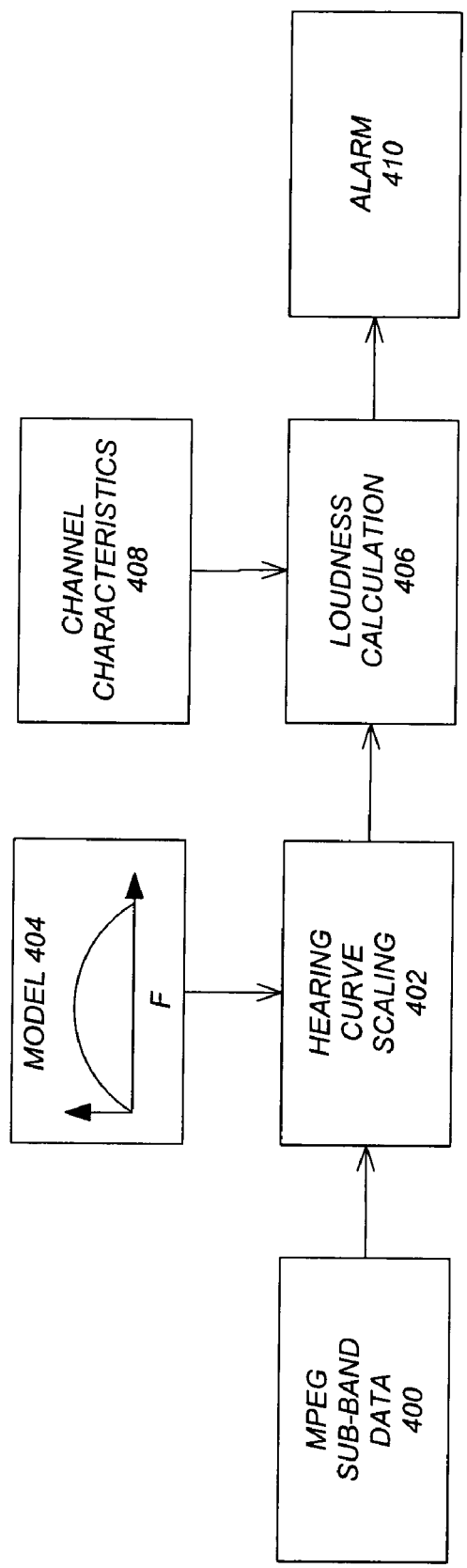
FIG. 4 is a diagram illustrating the loudness calculation performed by the software program of the audio presence and level monitoring system according the preferred embodiment of the present invention.

FIG. 4 is a diagram illustrating the audio presence and level function performed by the software program 306 of the audio presence and level monitoring system 300 according the preferred embodiment of the present invention. Specifically, the blocks of the diagram represent a method of automatic measurement of audio presence and level by direct processing of an MPEG data stream representing an audio signal.

Initially, the sub-band data 400 is extracted from the MPEG data stream. The values of the sub-band data 400 represents the strength of the audio signal in a frequency band covered by the sub-band data 400 at that point in time.

A hearing curve scaling function 402 performs the steps of dequantizing and denormalizing the extracted sub-band data, wherein the sub-band data 400 is dequantized according to the Bit Allocation 212, and the sub-band data 400 is denormalized using the Scale Factors 214. However, there is no need to further reconstruct the audio signal, which would complete the normal decoding process for the MPEG audio data stream 200. The sub-band data 400 is already in the frequency domain, so it is easily scalable to compensate for human ear sensitivity.

The hearing curve scaling function 402 also performs the step of using a psychoacoustic model 404 in determining a perceived level of the measured audio signal according to human ear sensitivity. Human ear sensitivity is frequency dependent and is more sensitive to mid-range frequencies (1-3 kHz) than to low or high frequency signals A loudness calculation 406 performs the steps of measuring an audio level for the dequantized and denormalized sub-band data 400 without reconstructing the audio signal using one or more channel characteristics 408, averaging the measured audio levels over time, and comparing the averaged audio levels against at least one application-specific threshold to determine whether the threshold is exceeded. The loudness calculation 406 typically involves measuring the signal power of the audio signal, as represented by the sub-band data 400, to determine the audio presence and level. However, the details of the calculation may vary by application.

The channel characteristics 408 are used to weight an instantaneous level or an overall level for a channel. For example, commercial advertising material typically has a different perceived level from the nominal program material, and it might be useful to exclude the instantaneous level for the commercial advertising material from the overall perceived level for a channel, because the commercial advertising material is normally a small percentage of total audio content. The exclusion can be accomplished using the channel characteristics 408, which may comprise a schedule for commercial breaks, or a label for the channel, or a label for the MPEG audio data stream, or some other indicator.

When a threshold is exceeded, an alarm 410 is triggered and passed onto the error monitoring system 312. Based on the alarm 410, one or more actions can be taken, i.e., adjusting audio levels, or tracing out the lost audio signal, or some other action. For example, a Simple Network Management Protocol (SNMP) agent may be used to report alarms, levels or other information as they occur.

Figure 5:
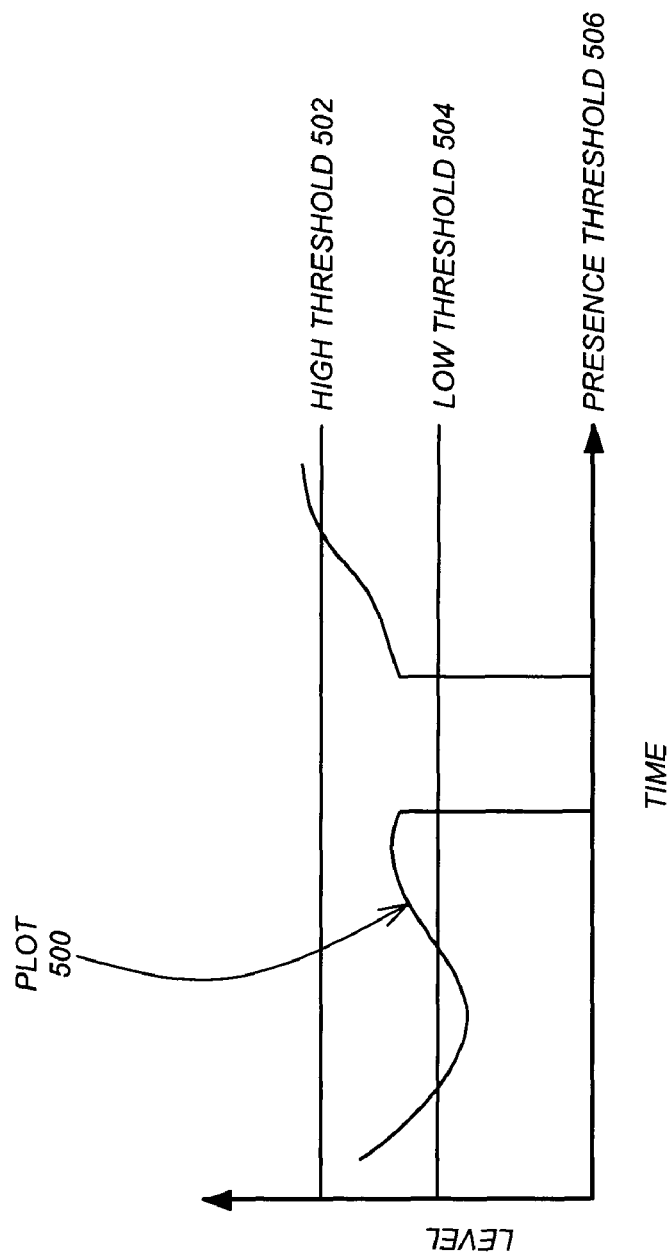
FIG. 5 is a graph showing a plot of audio levels as compared to time performed by an audio presence and level function in the preferred embodiment of the present invention.

FIG. 5 is a graph showing a plot 500 of audio levels as compared to time performed by the audio presence and level function of the software program 306 according to the preferred embodiment of the present invention. In the plot 500, the audio levels as compared to time are compared to a high threshold 502, low threshold 504 and presence threshold 506.

The thresholds 502, 504, and 506 can be determined by experimentation and tuned to yield the desired results. The audio presence and level function does not have to be perfect, but instead, only needs to be monotonic and reasonably linear.

In addition, the thresholds 502, 504, and 506 may vary from channel to channel depending on the channel characteristics 408 of a channel. Moreover, the channel characteristics 408 may vary over the course of the day and so the thresholds 502, 504, and 506 may also be varied by time of day, if that proves to be appropriate.

Conclusion

The foregoing description of the preferred embodiment of the invention has been presented for the purposes of illustration and description. It is not intended to be exhaustive or to limit the invention to the precise form disclosed. Many modifications and variations are possible in light of the above teaching.

For example, while the foregoing disclosure presents an embodiment of the present invention as it is applied to a satellite transmission system, the present invention can be applied to any application that uses MPEG audio. Moreover, although the present invention is described in terms of MPEG audio, it could also be applied to other compression schemes, such as Dolby® AC-3. Finally, although specific hardware, software and logic is described herein, those skilled in the art will recognize that other hardware, software or logic may accomplish the same result, without departing from the scope of the present invention.

It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method of automatic measurement of audio presence and level by direct processing of a data stream representing an audio signal in a processor, comprising:
    (a) extracting, in the processor, sub-band data from the data stream;
    (b) dequantizing and denormalizing, in the processor, the extracted sub-band data;
    (c) measuring, in the processor, an audio levd for the dequantized and denormalized sub-band data without reconstructing the audio signal using channel characteristics;
    (d) comparing, in the processor, the measured audio level against one or more thresholds; and
    (e) triggering, in the processor, an alarm as determined by the comparing step (d),
wherein the one or more thresholds are set to generate the alarm based on when an average of the audio level in the data stream is too high or too low, in order to monitor the audio presence and level within the data stream and to adjust the audio level as desired.

2. The method of claim 1, further comprising using a psychoacoustic model in determining a perceived level of the measured audio level according to human ear sensitivity.

3. The method of claim 1, wherein the channel characteristics are used to weight an instantaneous level.

4. The method of claim 1, wherein the channel characteristics are used to weight an overall level.

5. The method of claim 1, wherein the sub-band data represents the audio signal's strength in a frequency band represented by a sub-band at a particular point in time.

6. The method of claim 1, further comprising averaging the audio level over time.

7. The method of claim 1, further comprising thresholding the audio level.

8. In a processor, an apparatus for automatic measurement of audio presence and level by direct processing of a data stream representing an audio signal, comprising:
    (a) means for extracting sub-band data from the data stream;
    (b) means for dequantizing and denormalizing the extracted sub-band data;
    (c) means for measuring an audio level for the dequantized and denormalized sub-band data without reconstructing the audio signal using channel characteristics;
    (d) means for comparing the measured audio level against one or more thresholds; and
    (e) means for triggering an alarm as determined by the means for comparing (d), wherein the one or more thresholds are set to generate the alarm based on when an average of the audio level in the data stream is too high or too low, in order to monitor the audio presence and level within the data stream and to adjust the audio level as desired.

9. The apparatus of claim 8, further comprising means for using a psychoacoustic model in determining a perceived level of the measured audio level according to human ear sensitivity.

10. The apparatus of claim 8, wherein the channel characteristics are used to weight an instantaneous level.

11. The apparatus of claim 8, wherein the channel characteristics are used to weight an overall level.

12. The apparatus of claim 8, wherein the sub-band data represents the audio signal's strength in a frequency band represented by a sub-band at a particular point in time.

13. The apparatus of claim 8, further comprising means for averaging the audio level over time.

14. The apparatus of claim 8, further comprising means for thresholding the audio level.

15. The method of claim 1, further comprising the step of adjusting the audio level within the data stream according to the measured audio level.

16. The apparatus of claim 8, further comprising means for adjusting the audio level within the data stream according to the measured audio level.

* * * * *